(12) United States Patent
Bordow

(10) Patent No.: US 9,170,286 B2
(45) Date of Patent: Oct. 27, 2015

(54) REAL-TIME SPECTRUM ANALYZER INCLUDING FREQUENCY MASK GATE AND METHOD OF OPERATING THE SAME

(71) Applicant: Agilent Technologies, Inc., Loveland, CA (US)

(72) Inventor: Robin A. Bordow, Petaluma, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 232 days.

(21) Appl. No.: 13/745,008

(22) Filed: Jan. 18, 2013

(65) Prior Publication Data

US 2014/0207414 A1 Jul. 24, 2014

(51) Int. Cl.
*G01R 23/16* (2006.01)
*G01R 23/18* (2006.01)
*G01R 13/02* (2006.01)
*G06F 17/14* (2006.01)

(52) U.S. Cl.
CPC ............ *G01R 23/16* (2013.01); *G01R 13/0254* (2013.01); *G01R 23/18* (2013.01); *G06F 17/14* (2013.01)

(58) Field of Classification Search
USPC ........................................................ 702/180
See application file for complete search history.

(56) References Cited

U.S. PATENT DOCUMENTS

| 5,103,402 | A  | * | 4/1992  | Morton et al. ................... 702/76 |
| 7,251,577 | B2 |   | 7/2007  | Bernard et al. |
| 7,738,659 | B2 |   | 6/2010  | Moskowitz |
| 7,873,486 | B2 |   | 1/2011  | Earls |
| 8,180,586 | B2 |   | 5/2012  | Hillman, Jr. et al. |
| 2006/0025947 | A1 | * | 2/2006 | Earls ............................... 702/76 |
| 2011/0246134 | A1 | * | 10/2011 | Frishberg et al. ............. 702/179 |
| 2012/0128257 | A1 |   | 5/2012  | Quan |
| 2012/0213438 | A1 |   | 8/2012  | Quan |
| 2012/0306886 | A1 | * | 12/2012 | Bernard et al. ............ 345/440.1 |
| 2013/0158923 | A1 | * | 6/2013  | Stanton et al. .................. 702/76 |

* cited by examiner

*Primary Examiner* — Sujoy Kundu
*Assistant Examiner* — Paul D Lee

(57) ABSTRACT

A real-time spectrum analyzer for measuring time domain data sampled from an input signal includes a processing unit and a density histogram memory unit. The processing unit includes an FFT engine, a frequency mask detector and a frequency mask gate. The FFT engine performs FFTs on the sampled time domain data to provide FFT spectra, each FFT spectrum including multiple FFT points. The frequency mask detector determines whether each FFT point in each spectrum meets a trigger condition, and generates gate control signals corresponding to the FFT spectra based on the determinations. The frequency mask gate receives the FFT spectra and the gate control signals, and outputs only select FFT spectra that contain at least one FFT point that meets the trigger condition in response to the corresponding gate control signal. The density histogram memory unit stores the select FFT spectra for generating in a density histogram.

20 Claims, 2 Drawing Sheets

REAL-TIME SPECTRUM ANALYZER INCLUDING FREQUENCY MASK GATE AND METHOD OF OPERATING THE SAME

BACKGROUND

A conventional real-time spectrum analyzer generally receives a time domain input signal and displays corresponding frequency domain spectra, where each frequency domain spectrum represents a corresponding time interval. The spectra may be obtained by performing fast Fourier transforms (FFTs) on digital time domain data representing the time domain input signal. The display may be a density histogram display, which visually indicates the density of various frequencies. The density histogram display is periodically updated, where each update may be referred to as a "slice." Approximately 10,000 FFTs from multiple spectra form each slice.

A frequency mask trigger may be included in a conventional real-time spectrum analyzer to provide triggered measurements when used with a density histogram display. The frequency mask trigger is configured to detect a trigger condition in the spectra based on the frequency mask. When the trigger condition is detected, a fixed amount of data of the spectra is stored (and displayed), and then the trigger is re-armed. However, real-time gap free operation is lost during the data transfer, display, and re-arming processes. Further, using a conventional frequency mask trigger, all of the FFTs in the spectra of a histogram slice are displayed, regardless of how many of the FFTs actually meet the trigger condition. In other words, when the frequency mask trigger is turned on, if the trigger condition has been met for the slice, all of the FFTs of all of the spectra in that slice are displayed, even if only one FFT of one spectrum meets the trigger condition. This may be particularly problematic when the input signal is moving in and out of the trigger condition within a single slice, since the display of the slice will show FFTs that are both inside and outside the trigger condition. Although this feature may be desirable for batch mode stored data, it is not compatible with a continuous visual display of a gap-free density histogram in which a user wants to see only the domain spectra of the input signal that meet the trigger condition.

SUMMARY

In a representative embodiment, a real-time spectrum analyzer for measuring time domain data sampled from an input signal includes a processing unit and a density histogram memory unit. The processing unit includes a fast Fourier transform (FFT) engine, a frequency mask detector and a frequency mask gate. The FFT unit is configured to perform FFTs on the sampled time domain data to provide multiple FFT spectra corresponding to the time domain data, each FFT spectrum including multiple FFT points. The frequency mask detector is configured to determine whether each FFT point in each FFT spectrum meets at least one trigger condition, and to generate multiple gate control signals corresponding to the FFT spectra based on the determinations. The frequency mask gate is configured to receive the FFT spectra from the FFT engine and the gate control signals from the frequency mask detector, and to output only select FFT spectra of the FFT spectra that contain at least one FFT point that meets the at least one trigger condition in response to the corresponding gate control signal. The density histogram memory unit is configured to store the select FFT spectra output by the frequency mask gate for generating in a density histogram corresponding to the sampled time domain data.

In another representative embodiment, a method executed by a real-time spectrum analyzer provides a density histogram of sampled time domain data from an input signal in real-time. The method includes providing a continuous gap-free stream of FFT spectra obtained by performing FFTs on the sampled time domain data; selecting FFT spectra from the stream of FFT spectra that contain at least one FFT point that meets at least one trigger condition; and generating a density histogram using only the selected FFT spectra.

In another representative embodiment, a method executed by a real-time spectrum analyzer provides a density histogram of sampled time domain data in real-time. The method includes performing FFTs on the sampled time domain data to obtain corresponding FFT spectra, each FFT spectrum containing multiple FFT points; determining whether each FFT point within each FFT spectrum meets at least one trigger condition using a frequency mask detector; generating gate control signals corresponding to the FFT spectra based on the determinations; gating the FFT spectra using a frequency mask gate in response to the gate control signals, respectively, to provide only select FFT spectra respectively containing at least one FFT point meeting the at least one trigger condition; and displaying a density histogram based on the gated FFT spectra.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, illustrative embodiments disclosing specific details are set forth in order to provide a thorough understanding of embodiments according to the present teachings. However, it will be apparent to one having had the benefit of the present disclosure that other embodiments according to the present teachings that depart from the specific details disclosed herein remain within the scope of the appended claims. Moreover, descriptions of well-known devices and methods may be omitted so as not to obscure the description of the example embodiments. Such methods and devices are within the scope of the present teachings. Generally, it is understood that the drawings and the various elements depicted therein are not drawn to scale.

According to various embodiments, a real-time spectrum analyzer includes a frequency mask gate configured to use trigger condition information from FFT points of frequency domain FFT spectra within a single histogram slice to make gating decisions regarding FFT spectra. According to the gating decisions, FFT spectra that include FFT points meeting the trigger condition are stored in memory (and displayed) and FFT spectra that do not include FFT points meeting the trigger condition are blocked from memory. For example, if 10,000 FFT points are obtained for the slice, and 50 FFT points meet the trigger condition, then only the FFT spectra including at least one of the 50 FFT points will be written into memory for the histogram slice. For instance, if all 50 FFT points are in one FFT spectrum, then only that one FFT spectrum is written into memory. If none of the 10,000 FFT points meet the trigger condition, then no FFT spectra will be written into memory. Regardless, a continuous gap-free series of slices are sent to the memory for histogram display updates. That is, some of the slices may be empty if no corresponding FFT spectra include FFT points that meet the trigger condition, thus producing blank display(s) until at least one FFT point in a slice meets the trigger condition. The end result is a continuous gap-free visual display of only those FFT spectra that include FFT points meeting the trigger condition.

Figure 1:
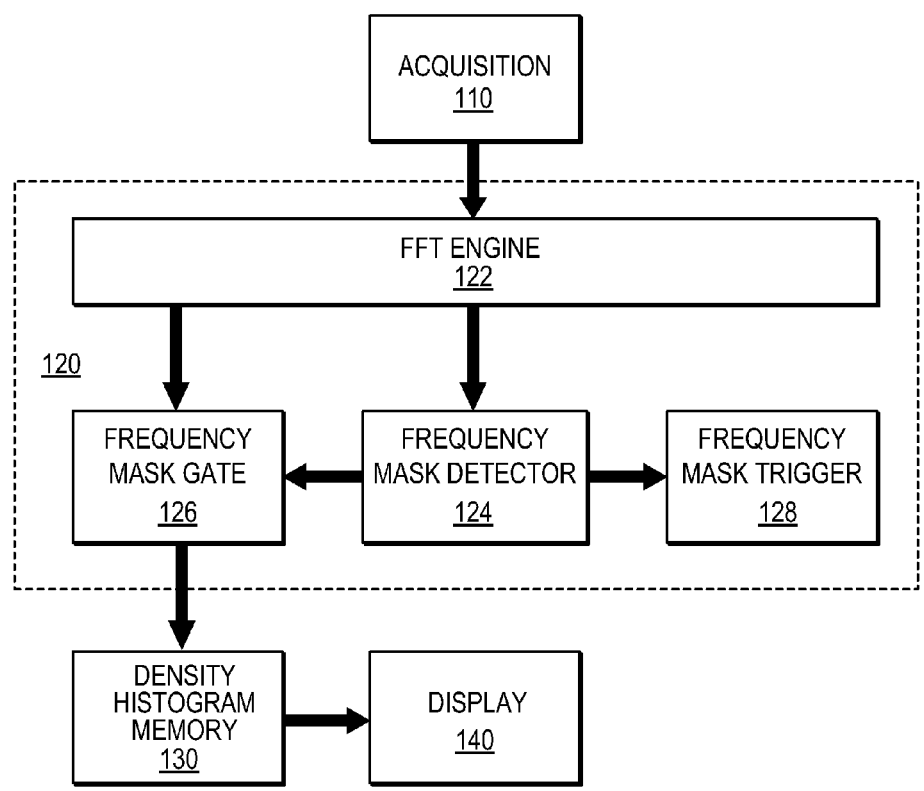
FIG. 1 is a simplified block diagram of a real-time spectrum analyzer, according to a representative embodiment.

FIG. 1 is a simplified block diagram of a real-time spectrum analyzer, according to a representative embodiment.

Referring to FIG. 1, real-time spectrum analyzer 100 includes signal acquisition unit 110, processing unit 120, memory unit 130 and display unit 140. The signal acquisition unit 110 is configured to receive and sample an input signal, and to output a stream of digital time domain data representing the input signal in the time domain. For example, the input signal may be an electrical or optical signal output from a device under test being analyzed by the real-time spectrum analyzer 100. The signal acquisition unit 110 may include various components (not shown) for demodulating, filtering and digitizing the sampled input signal, as would be apparent to one of ordinary skill in the art. The time domain data is provided to the processing unit 120.

In the depicted embodiment, the processing unit 120 includes an FFT engine 122, a frequency mask detector 124, a frequency mask gate 126 and a frequency mask trigger 128. The FFT engine 122 is configured to perform fast Fourier transforms on the time domain data received from the signal acquisition unit 110 to provide a continuous gap-free stream of FFT spectra representing the input signal in the frequency domain, thereby converting the time domain data to frequency domain data. Each FFT spectrum includes multiple FFT points corresponding to data within a specified time interval, where each FFT point includes a frequency and a corresponding amplitude of the input signal. The FFT spectra including the FFT points are output by the FFT engine 122 to the frequency mask detector 124 and the frequency mask gate 126, providing a continuous gap-free series of FFT points for processing.

The frequency mask detector 124 is configured to detect one or more previously determined triggers, based on comparison to one or more associated frequency masks, by detecting corresponding trigger conditions in the FFT spectra. The triggers and/or frequency masks may be user-defined. For example, a trigger may be based on frequency ranges and/or amplitudes of the input signal in comparison with the frequency mask. Although more than one frequency mask and trigger may implemented by the real-time spectrum analyzer 100, the discussion below is directed to a single frequency mask and trigger for convenience of explanation.

For each FFT spectrum received from the FFT engine 122, the frequency mask detector 124 determines whether each FFT point within that FFT spectrum meets the trigger condition associated with the predetermined trigger, thus identifying FFT spectra that contain at least one FFT point that meets the trigger condition. The frequency mask detector 124 generates gate control signals corresponding to the FFT spectra received from the FFT engine 122 based on the determination. That is, each gate control signal reflects whether the corresponding FFT spectrum includes one or more FFT points meeting the trigger condition. For example, when an FFT spectrum includes at least one FFT point that meets a trigger condition, the frequency mask detector 124 generates a positive gate control signal (e.g., the value of the gate control signal corresponding to that FFT spectrum may be set to one or high), and when an FFT spectrum does not include any FFT points that meet the trigger condition, the frequency mask detector 124 generates a negative gate control signal (e.g., the value of the control signal corresponding to that FFT spectrum may be set to zero or low). Of course, the gate control signals may vary according to various configurations without departing from the scope of the present teachings.

The frequency mask gate 126 is configured to receive the FFT spectra from the FFT engine 122 and to selectively gate the FFT spectra into the memory unit 130 for display based on the corresponding gate control signals provided by the frequency mask detector 124. For example, the frequency mask gate 126 may write into the memory unit 130 each FFT spectrum having a corresponding positive gate control signal, and not write into the memory unit (block) each FFT spectrum having a corresponding negative gate control signal. Of course the roles of the positive and negative gate control signals may be reversed in various embodiments, without departing from the scope of the present teachings. Generally, the frequency mask detector 124 and the frequency mask gate 126 work together synchronously on FFT spectra in the order they are received.

The FFT spectra are grouped into slices for updating the histogram display. The grouping is based on the number of FFT spectra that forms one histogram display update (e.g., approximately 10,000 FFT spectra). The grouping may be performed by various components of the processing unit 120, such as programmable registers, digital logic control, and memory controller (not shown), as would be apparent to one of ordinary skill in the art. The number of FFT spectra in each slice may be programmed as a fixed number, e.g., in a programmable register, or can be controlled via an interrupt signal, e.g., from a memory controller.

The memory unit 130 is configured to output the stored FFT spectra to enable the display unit 140 to display corresponding slices of the histogram display during consecutive histogram display updates, respectively. For example, when one slice ends and another begins, two buffers within the density histogram memory unit 130 may be swapped to avoid interruption of the FFT spectra. When no FFT spectra have been stored in the memory unit 130 for a particular slice (i.e., no FFT points of the FFT spectra met the trigger condition), the display unit 140 provides a blank display for that (empty) slice during the corresponding histogram display update. The display unit 140 therefore is able to provide a continuous gap-free histogram display of only FFT spectra in each slice that include FFT points meeting the trigger condition. The memory unit 130 may be any suitable type of non-transitory, tangible computer readable medium that is writable readable, including random access memory (RAM), such as static RAM (SRAM), a disk drive, a CD, a DVD, a universal serial bus (USB) drive, and the like. In an embodiment, the computer readable medium may be RAM embedded as Block RAM in the field-programmable gate arrays (FPGAs) used to implement the processing unit 120, discussed below.

The processing unit 120 may also include the frequency mask trigger 128, which functions in essentially the same manner as a conventional frequency mask trigger. That is, the frequency mask trigger 128 is configured to trigger a batch mode capture of the FFT spectra (or the corresponding time domain data) in response to a frequency mask trigger signal provided by the frequency mask detector 124. The frequency mask detector 124 provides the frequency mask trigger signal when any of the FFT spectra in a slice includes one or more FFT points that meet one or more trigger conditions. In an embodiment, the display unit 140 may be further configured to display a density histogram generated in response to the batch mode capture, instead of a density histogram generated in response to the selective gating process using the gate control signals, discussed above.

The processing unit 120 may be implemented using one or more processing devices, such as a processor, a microprocessor, a digital signal processor (DSP), one or more application specific integrated circuits (ASICs), one or more FPGAs, or combinations thereof, using software, firmware, hard-wired logic circuits, or combinations thereof. The FFT engine 122, the frequency mask detector 124, the frequency mask gate 126 and the frequency mask trigger 128, which are depicted separately for convenience of explanation, may be implemented as software, firmware and/or hardware modules using the same or different processing devices. The processing unit 120 may have access to memory (not shown), comprising a non-transitory, tangible computer readable medium for storing operating software, modules, data and algorithms for executing the various embodiments described herein. Examples of a computer readable medium include various types of nonvolatile read only memory (ROM) and volatile RAM, such as SRAM, Block RAM, a disk drive, EPROM, EEPROM, a CD, a DVD, a USB drive, and the like.

Figure 2:
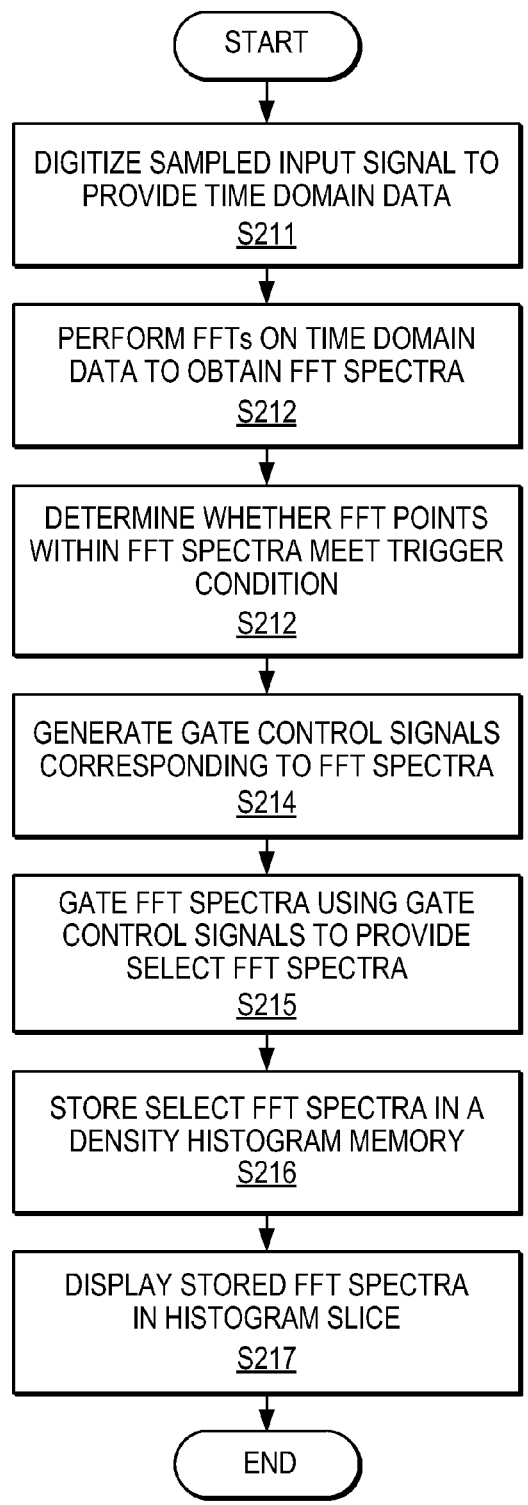
FIG. 2 is a flow diagram showing a process implemented by a real-time spectrum analyzer, according to a representative embodiment.

FIG. 2 is a flow diagram showing a process for providing a density histogram of sampled time domain data in real-time, according to a representative embodiment.

Referring to FIG. 2, in block S211, a sampled input signal is digitized to provide time domain data representative of the input signal in the time domain. FFTs are performed on the sampled time domain data in block S212 to obtain corresponding FFT spectra representative of the input signal in the frequency domain. Each FFT spectrum contains multiple FFT points having corresponding frequencies and amplitudes. The FFT spectra are provided to a frequency mask detector (e.g., frequency mask detector 124) and a frequency mask gate (e.g., frequency mask gate 126) at substantially the same time.

In block S213, it is determined whether the FFT points within each FFT spectrum meets a trigger condition using the frequency mask detector. For example, the frequency mask detector may check every FFT point within each FFT spectrum, or it may only check FFT points until one is found that meets the trigger condition and then move on to the next FFT spectrum. In response to the determinations, gate control signals corresponding to the FFT spectra are generated by the frequency mask detector in block S214. That is, each FFT spectrum has a corresponding gate control signal, which is provided to the frequency mask gate (e.g., frequency mask gate 126), indicating whether the FFT spectra includes at least one FFT point that meets the trigger condition. For example, as discussed above, a positive gate control signal may be provided when the FFT spectra includes at least one FFT point meeting the trigger condition and a negative gate control signal may be provided when the FFT spectra does not include any FFT points meeting the trigger condition.

The FFT spectra are gated by the frequency mask gate in block S215 using the gate control signals, respectively, to output only select FFT spectra respectively containing at least one FFT point meeting the trigger condition. The select FFT spectra are stored in a density histogram memory (e.g., memory unit 130) in block S216, and the stored FFT spectra are displayed in a histogram slice by a display (e.g., display unit 140) in block S217 as part of a histogram display update.

The various operations discussed above with reference to FIG. 2 may be included in logic executable by a computer processor or other processing device, such as the processing unit 120, discussed above, and/or some combination of processing devices (e.g., by distributed processing). The operations may be implemented using internal logic or software, stored on a computer readable medium, and executable by one or more computer processors, ASICs, FPGAs or combinations thereof, as discussed above.

The various embodiments provide the ability to display and update a gap-free density histogram showing only those FFT spectra including FFT points that meet one or more frequency mask conditions. The continuous gap free process may be applied to both the density histogram and real-time spectrum features of a real-time spectrum analyzer.

While the disclosure references exemplary embodiments, it will be apparent to those skilled in the art that various changes and modifications may be made without departing from the spirit and scope of the present teachings. Therefore, it should be understood that the above embodiments are not limiting, but illustrative.

What is claimed is:

1. A real-time spectrum analyzer for measuring time domain data sampled from an input signal, the real-time spectrum analyzer comprising:
    a processing unit comprising:
        a fast Fourier transform (FFT) engine configured to perform FFTs on the sampled time domain data to provide a plurality of FFT spectra corresponding to the time domain data, each FFT spectrum comprising a plurality of FFT points;
        a frequency mask detector configured to determine whether each FFT point of the plurality of FFT points in each FFT spectrum meets at least one trigger condition, and to generate a plurality of gate control signals corresponding to the plurality of FFT spectra based on the determinations; and
        a frequency mask gate configured to receive the plurality of FFT spectra from the FFT engine and the plurality of gate control signals from the frequency mask detector, and to output only select FFT spectra of the plurality of FFT spectra that contain at least one FFT point that meets the at least one trigger condition in response to the corresponding gate control signal; and
    a density histogram memory unit configured to store the select FFT spectra output by the frequency mask gate for generating in a density histogram corresponding to the sampled time domain data.

2. The real-time spectrum analyzer of claim 1, further comprising:
    a display unit configured to receive the select FFT spectra stored in the density histogram memory unit, and to display the generated density histogram corresponding to the sampled time domain data.

3. The real-time spectrum analyzer of claim 2, wherein the frequency mask detector is further configured to generate a frequency mask trigger signal when at least one FFT point of the plurality of FFT points within at least one FFT spectrum of the plurality of FFT spectra meets the at least one trigger condition.

4. The real-time spectrum analyzer of claim 3, wherein the processing unit further comprises:
    a frequency mask trigger configured to trigger a batch mode capture of the plurality of FFT spectra or the corresponding time domain data in response to the frequency mask trigger signal generated by the frequency mask detector.

5. The real-time spectrum analyzer of claim 4, wherein the display unit is further configured to display a density histogram generated in response to the batch mode capture.

6. The real-time spectrum analyzer of claim 2, wherein the plurality of FFT spectra provided by the FFT engine comprises a continuous gap-free stream of the plurality of FFT spectra.

7. The real-time spectrum analyzer of claim 6, wherein the display of the generated density histogram comprises a continuous gap-free visual display of the select FFT spectra.

8. The real-time spectrum analyzer of claim 1, wherein each of the FFT engine, the frequency mask detector, and the frequency mask gate are comprised of one or more field-programmable gate arrays (FPGAs).

9. The real-time spectrum analyzer of claim 1, wherein each FFT point of the plurality of FFT spectra comprises a frequency and a corresponding amplitude of the input signal.

10. A method executed by a real-time spectrum analyzer for providing a density histogram of sampled time domain data from an input signal in real-time, the method comprising:
providing a continuous gap-free stream of a plurality of fast Fourier transform (FFT) spectra to a frequency mask detector and a frequency mask gate, the continuous gap-free stream of the plurality of FFT spectra being obtained by performing FFTs on the sampled time domain data;
selecting at the frequency mask gate FFT spectra of the plurality of FFT spectra that contain at least one FFT point that meets at least one trigger condition, as determined by the frequency mask detector; and
generating a density histogram using the selected FFT spectra.

11. The method of claim 10, further comprising:
displaying the generated density histogram.

12. The method of claim 11, wherein displaying the density histogram comprises producing a blank display when no FFT spectra contain at least one FFT point that meets the at least one trigger condition.

13. The method of claim 10, wherein selecting the FFT spectra of the plurality of FFT spectra that contain at least one FFT point that meets the at least one trigger condition comprises:
identifying FFT spectra of the plurality of FFT spectra that contain at least one FFT point that meets the at least one trigger condition using the frequency mask detector; and
gating the identified FFT spectra using the frequency mask gate in response to corresponding gate control signals provided by the frequency mask detector to provide the selected FFT spectra.

14. The method of claim 13, wherein each of the selected FFT points within each FFT spectrum comprises a frequency and a corresponding amplitude of the input signal.

15. A method executed by a real-time spectrum analyzer for providing a density histogram of sampled time domain data in real-time, the method comprising:
performing fast Fourier transforms (FFTs) on the sampled time domain data to obtain a corresponding plurality of FFT spectra, each FFT spectrum containing a plurality of FFT points;
determining whether FFT points within each FFT spectrum meet at least one trigger condition using a frequency mask detector;
generating a plurality of gate control signals corresponding to the plurality of FFT spectra based on the determinations;
gating the plurality of FFT spectra using a frequency mask gate in response to the plurality of gate control signals, respectively, to provide only select FFT spectra respectively containing at least one FFT point meeting the at least one trigger condition; and
displaying a density histogram based on the gated FFT spectra.

16. The method of claim 15, further comprising:
storing only the select FFT spectra in a density histogram memory for displaying the density histogram.

17. The method of claim 15, wherein performing the FFTs comprises converting the sampled time domain data from time domain data to frequency domain data.

18. The method of claim 15, wherein displaying the density histogram comprises producing a blank display when no FFT points meet the at least one trigger condition.

19. The method of claim 15, further comprising:
generating a frequency mask trigger signal when at least one FFT point within the plurality of FFT spectra meets at least one trigger condition.

20. The method of claim 19, further comprising:
performing a batch mode capture of the plurality FFT spectra in response to the frequency mask trigger signal.

* * * * *